(12) United States Patent
Ecarnot et al.

(10) Patent No.: US 10,777,447 B2
(45) Date of Patent: Sep. 15, 2020

(54) METHOD FOR DETERMINING A SUITABLE IMPLANTING ENERGY IN A DONOR SUBSTRATE AND PROCESS FOR FABRICATING A STRUCTURE OF SEMICONDUCTOR-ON-INSULATOR TYPE

(71) Applicant: Soitec, Bernin (FR)

(72) Inventors: Ludovic Ecarnot, Vaulnaveys-le-Haut (FR); Nadia Ben Mohammed, Echirolles (FR); Carine Duret, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/081,816

(22) PCT Filed: Mar. 2, 2017

(86) PCT No.: PCT/FR2017/050471
§ 371 (c)(1),
(2) Date: Aug. 31, 2018

(87) PCT Pub. No.: WO2017/149253
PCT Pub. Date: Sep. 8, 2017

(65) Prior Publication Data
US 2019/0074215 A1    Mar. 7, 2019

(30) Foreign Application Priority Data

Mar. 2, 2016 (FR) .................................... 16 51747

(51) Int. Cl.
*H01L 21/762* (2006.01)
*H01L 21/66* (2006.01)
(Continued)

(52) U.S. Cl.
CPC .. *H01L 21/76254* (2013.01); *H01L 21/02532* (2013.01); *H01L 21/2007* (2013.01);
(Continued)

(58) Field of Classification Search
CPC ..... H01L 21/2007; H01L 22/12; H01L 22/20; H01L 21/84
See application file for complete search history.

(56) References Cited

U.S. PATENT DOCUMENTS 7,232,737 B2 *  6/2007  Daval ............... H01L 21/26506
                                                        438/455
7,575,988 B2 *  8/2009  Bourdelle ............. H01L 21/187
                                                        257/E21.088
(Continued)

FOREIGN PATENT DOCUMENTS

EP       1777735 A2    4/2007
WO    2009/034113 A1    3/2009

OTHER PUBLICATIONS

Moriceau et al., Smart Cut<TM>: review on an Attractive Process for Innovative Substrate Elaboration, Nuclear Instruments & Methods in Physics Research, Section B. Beam Interactions with Materials and Atoms, Elsevier B.V., vol. 277, (Apr. 15, 2012), pp. 84-92.
(Continued)

*Primary Examiner* — Savitri Mulpuri
(74) *Attorney, Agent, or Firm* — TraskBritt

(57) ABSTRACT

A method for determining a suitable implanting energy of at least two atomic species in a donor substrate to create a weakened zone defining a monocrystalline semiconductor layer to be transferred onto a receiver substrate, comprises the following steps:
(i) forming a dielectric layer on at least one of the donor substrate and the receiver substrate;
(ii) co-implanting the species in the donor substrate;
(iii) bonding the donor substrate on the receiver substrate;
(iv) detaching the donor substrate along the weakened zone to transfer the monocrystalline semiconductor layer and recover the remainder of the donor substrate;
(v) inspecting the peripheral crown of the remainder of the donor substrate, or of the receiver substrate on which the monocrystalline semiconductor layer was transferred at step (iv);
(vi) if the crown exhibits zones transferred onto the receiver substrate, determining the fact that the implanting energy at step (ii) is too high;

(Continued)

(vii) if said the crown does not exhibit zones transferred onto the receiver substrate, determining the fact that the implanting energy at step (ii) is suitable.

6 Claims, 4 Drawing Sheets

(51) Int. Cl.
*H01L 21/02* (2006.01)
*H01L 21/20* (2006.01)
*H01L 21/84* (2006.01)

(52) U.S. Cl.
CPC .............. *H01L 21/84* (2013.01); *H01L 22/12* (2013.01); *H01L 22/20* (2013.01)

(56) References Cited

U.S. PATENT DOCUMENTS

| 8,153,500 B2 * | 4/2012 | Faure ................ H01L 21/76254 257/E21.211 |
| 2007/0148917 A1 | 6/2007 | Morita et al. |
| 2012/0199956 A1 | 8/2012 | Lecomte et al. |

OTHER PUBLICATIONS

International Written Opinion for International Application No. PCT/FR2017/050471 dated May 24, 2017, 7 pages.
International Search Report for International Application No. PCT/FR2017/050471 dated May 24, 2017, 3 pages.
Agarwal et al., Efficient Production of Silicon-on-Insulator Films by Co-Implantation of He+ with H+, Applied Physics Letters, A I P Publishing LLC, vol. 72, No. 9, (Mar. 2, 1998), pp. 1086-1088.

\* cited by examiner under 35 U.S.C.
METHOD FOR DETERMINING A SUITABLE IMPLANTING ENERGY IN A DONOR SUBSTRATE AND PROCESS FOR FABRICATING A STRUCTURE OF SEMICONDUCTOR-ON-INSULATOR TYPE

CROSS-REFERENCE TO RELATED APPLICATIONS

This application is a national phase entry under 35 U.S.C. § 371 of International Patent Application PCT/FR2017/050471, filed Mar. 2, 2017, designating the United States of America and published as International Patent Publication WO 2017/149253 A1 on Sep. 8, 2017, which claims the benefit under Article 8 of the Patent Cooperation Treaty to French Patent Application Serial No. 1651747, filed Mar. 2, 2016.

TECHNICAL FIELD

The present disclosure relates to a process for fabricating a structure via layer transfer. This process is more particularly implemented for the manufacturing of structures of "Semiconductor-On-Insulator" (SeOI) type using a technique of the SMART CUT® type.

BACKGROUND

The SMART CUT® process allows the transfer of a thin semiconductor layer from a donor substrate to a receiver substrate and applies the following steps:
  a) Implanting atomic species in the donor substrate to create a weakened zone, the depth of which corresponds to the thickness of the thin layer it is desired to transfer.
  b) Contacting the substrates and bonding via molecular bonding.

Bonding occurs over the entire surface of the substrates except on the periphery since the wafers have an Edge Roll Off (ERO) and are, therefore, not in contact on their periphery as can be seen in FIG. 1.
  c) Detaching along the weakened zone of the donor substrate, and transfer of the thin layer onto the receiver substrate.

Substrates are generally in the form of circular wafers; e.g., wafers of 300 mm are commonly used.

The peripheral region where transfer of the thin layer does not take place is known as a "crown." With reference to FIG. 2 illustrating an overhead view of four peripheral regions of an SeOI wafer, the crown CP is delimited on the outer side by the edge 100 of the receiver substrate and on the inner side by the edge 200 of the transferred layer. The wafer in FIG. 2 has a regular crown CP, in other words, the edge of the SeOI is regular.

However, in some cases, a jagged edge is obtained on the end product, i.e., the SeOI obtained after detachment. After detachment, it can occur that the crown also comprises small, isolated transferred zones.

The width of the crown is, therefore, made jagged through the local, uncontrolled extension of the transferred region over several hundred micrometers, toward the edge of the receiver substrate. The extension of the transferred region can be seen in the photos in FIG. 3 where the lightest region corresponds to the transferred layer and the darkest layer is the crown.

One situation in which a jagged crown is observed is when the surface of at least one of the substrates is activated before molecular bonding, e.g., via plasma activation. This activation allows significant reinforcing of bonding energy. The reinforcing of bonding energy can also be obtained by adapted cleaning before bonding, e.g., a sequence of $O_3$/SC1/SC2 type where SC1 is conducted at a temperature lower than 50° C.

Patent application WO 2009/034113 by the Applicant proposes overcoming this disadvantage by controlling activation of the surface of the substrate so that the increase in bonding energy between the donor substrate and receiver substrate, in a peripheral region of these substrates, is lower than the increase in bonding energy in the central region of the substrates.

However, situations subsist in which the jagged edge phenomenon is still observed, even when the abovementioned controlling is applied. These are, in particular, cases in which the transferred semiconductor layer is of a large thickness, i.e., typically greater than or equal to 370 nm, and in which the weakened zone is formed by co-implantation of two different species, generally hydrogen and helium.

Yet this undesired transfer into the crown creates a weaker zone in which the transferred semiconductor layer is likely to undergo chemical attack through its interface with the receiver substrate (phenomenon known as "under etching") and will delaminate.

One solution to overcome this type of defect would be to remove the zones transferred into the crown via mechanical or chemical action.

However, the performing of such corrective operations would be complicated to implement on an industrial scale and would impact the manufacturing cost of SeOI structures.

BRIEF SUMMARY

It is, therefore, one of the objectives of the disclosure to improve the process for fabricating a structure via layer transfer so as to guarantee a regular edge of a transferred layer without any local extension.

For this purpose, the disclosure describes a method for determining a suitable implanting energy of at least two atomic species in a donor substrate, to create a weakened zone defining a monocrystalline semiconductor layer to be transferred onto a receiver substrate, comprising the following steps:
  (i) forming a dielectric layer on at least one of the donor substrate and the receiver substrate;
  (ii) co-implanting the species in the donor substrate with a determined energy to form the weakened zone;
  (iii) bonding the donor substrate on the receiver substrate so that the dielectric layer lies at the bonding interface;
  (iv) detaching the donor substrate along the weakened zone to transfer the monocrystalline semiconductor layer and recover the remainder of the donor substrate;
  (v) inspecting the peripheral crown of the remainder of the donor substrate or of the peripheral crown of the receiver substrate on which the monocrystalline semiconductor layer was transferred at step (iv);
  (vi) if the crown exhibits zones transferred onto the receiver substrate, determining the fact that the implanting energy at step (ii) is too high;
  (vii) if the crown does not exhibit zones transferred onto the receiver substrate, determining the fact that the implanting energy at step (ii) is suitable.

Advantageously, step (ii) is implemented on a plurality of donor substrates with different respective implanting energies, and on inspection of the remainder of the donor substrate or of the receiver substrate on which the monocrystalline semiconductor layer has been transferred, a suitable range of implanting energy is determined for each of the implanting energies.

It is thus possible to determine the maximum implanting energy within the suitable range of implanting energy, and to deduce therefrom the maximum thickness of the monocrystalline semiconductor layer to be transferred onto the receiver substrate.

A further subject of the disclosure concerns a process for manufacturing a structure of simiconductor-on-insulator type via transfer of a monocrystalline semiconductor layer from a donor substrate to a receiver substrate, comprising the following steps:
(a) determining a suitable implanting energy with the above-described method;
(b) forming a dielectric layer on at least one of the receiver substrate and the donor substrate;
(c) co-implanting atomic species, such as hydrogen and helium, with the implanting energy determined at step (a), to create a weakened zone in the donor substrate so as to define a monocrystalline semiconductor layer to be transferred;
(d) molecularly bonding the donor substrate on a receiver substrate, the dielectric layer lying at the bonding interface;
(e) detaching the donor substrate along the weakened zone to transfer the monocrystalline semiconductor layer onto the receiver substrate.

According to one embodiment of the disclosure, the suitable implanting energy determined at step (a) corresponds to a thickness of the layer transferred at step (e) that is narrower than the desired thickness for the monocrystalline semiconductor layer of the simiconductor-on-insulator structure, the process further comprising, after step (e), an epitaxy step (f) on the layer transferred onto the receiver substrate until the desired thickness is obtained.

BRIEF DESCRIPTION OF THE DRAWINGS

Other characteristics and advantages of the disclosure will become further apparent from the following detailed description given with reference to the accompanying drawings in which.

DETAILED DESCRIPTION

Figure 1:
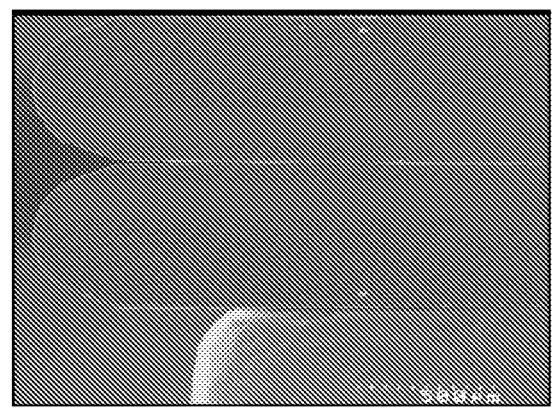
FIG. 1 is a cross-sectional photo of two bonded wafers showing the edge roll off of the wafers resulting in the SeOI crown.
Figure 2:
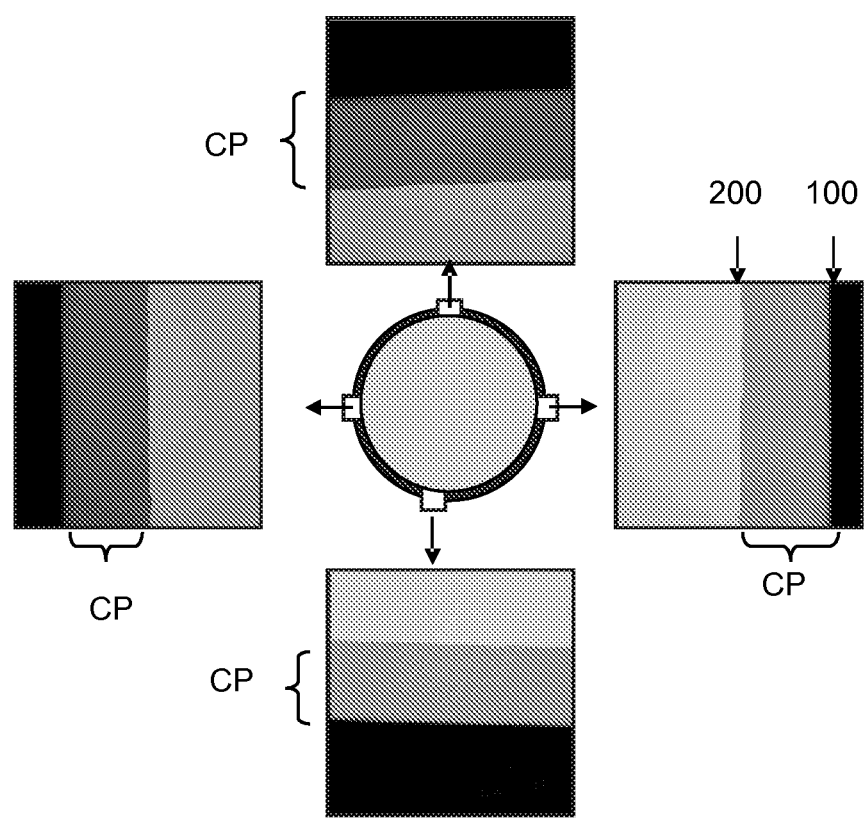
FIG. 2 is an overhead photo of the edge of an SeOI wafer having a regular crown.
Figure 3:
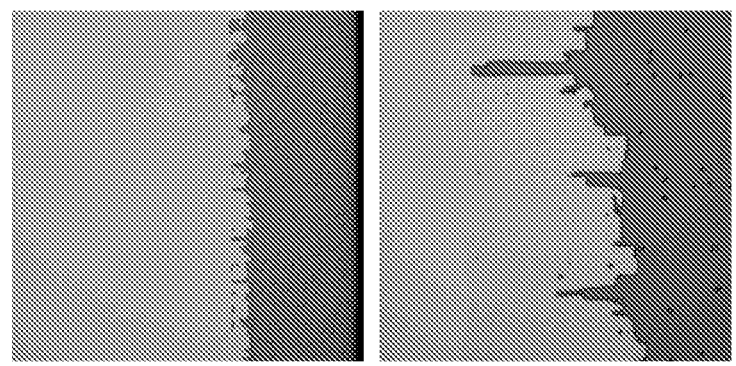
FIG. 3 is a photo of the crown of a wafer exhibiting the jagged edge phenomenon.
Figure 4:
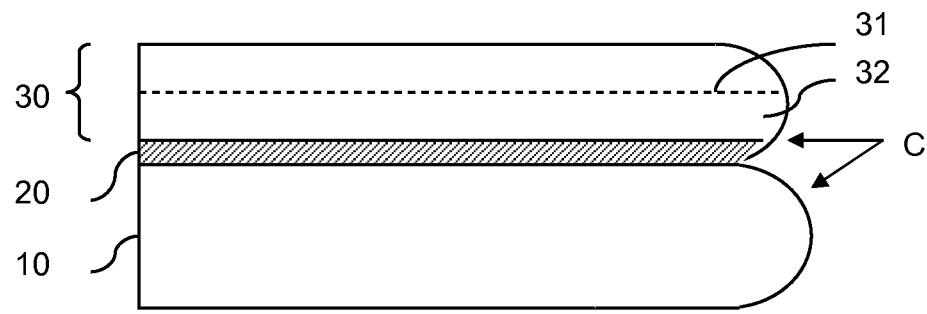
FIG. 4 is a cross-sectional view of a structure after bonding a donor substrate onto a receiver substrate for manufacturing an SeOI.

FIG. 4 illustrates the structure obtained after bonding a donor substrate 30 onto a receiver substrate 10.

When implementing the SMART CUT® process, the donor substrate 30 (and/or the receiver substrate) may be coated, for example, with a dielectric layer 20, in particular, an oxide layer. As is known to persons skilled in the art, the oxide can be deposited or formed by thermal oxidation of the donor substrate.

The donor substrate 30 then undergoes co-implanting of at least two atomic species, e.g., hydrogen and helium, the dose and energy of which are adapted to obtain an implantation peak at a depth corresponding to the thickness of the layer of the donor substrate it is desired to transfer. The zone 31 in which the atomic species are implanted is called a weakened zone. By mean of this co-implantation, the helium atoms contribute toward confining the hydrogen atoms, allowing improved quality of subsequent detachment along the weakened zone. The implanting of these two species is staggered in time. Also, the implanting energies of the two species (which depend on the weight of the respective species) are not necessarily identical. It is within the reach of those skilled in the art to define the dose and energy parameters for the two species, as a function of the depth of the weakened zone to be formed.

After optional activation via plasma of the surface of the donor substrate 30 and/or receiver substrate 10, the substrates are placed in contact and molecularly bonded. The effect of plasma activation is to increase the bonding energy between the two substrates. This increase in bonding energy can also be obtained by cleaning before bonding of $O_3$/RCA clean type wherein SC1 is conducted at a temperature lower than 50° C. This cleaning is well known to skilled persons and, therefore, will not be described in detail. It is simply recalled that RCA comprises a sequence of so-called SC1 and SC2 baths. SC1 is a mixture of $H_2O$, $H_2O_2$ and $NH_4OH$. SC2 is a mixture of $H_2O$, $H_2O_2$ and HCl. Rinses with $H_2O$ are carried out between these SC1 and SC2 baths. $O_3$ cleaning corresponds to a first bath of $H_2O$ in which ozone gas is dissolved.

As can be seen in FIG. 4, the wafers of the two substrates do not have an edge perpendicular to the surface but have an Edge Roll Off indicated by the arrows C. Therefore, the substrates 10 and 30 are not bonded as far as their edge but as far as the edge roll off.

Figure 5:
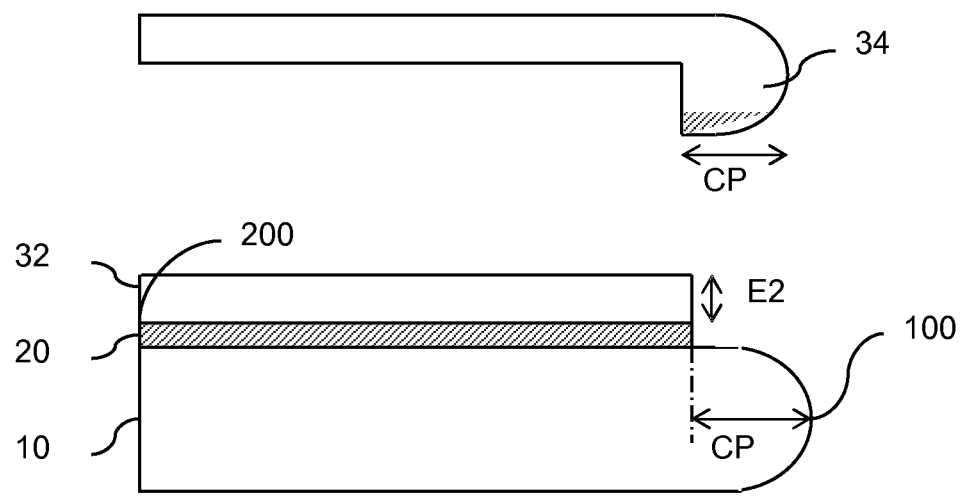
FIG. 5 is a cross-sectional view of the preceding structure after detaching and transfer of a monocrystalline semiconductor layer.

The donor substrate 30 is then detached along the weakened zone 31. For this purpose, detachment can be initiated using mechanical forces or a temperature rise; detachment propagates over the entire surface in the form of a detachment wave. The SeOI structure thus obtained is illustrated in FIG. 5. Owing to the presence of the edge roll off of the wafers, the transferred part of the donor substrate 30 does not normally extend over the entire surface of the receiver substrate 10, but only as far as the limit of a peripheral crown CP.

For a 300 mm wafer, the peripheral crown CP typically has a width of 1 mm relative to the edge of the wafer.

The jagged edge phenomenon described in the introduction translates as the presence of transferred zones (i.e., of oxide dielectric layer 20 and thin monocrystalline semiconductor layer 32) inside the peripheral crown CP.

The jagged edge phenomenon appears to be due to the fact that the hydrogen and helium implanting energies are too high.

Yet, such energies may be required to form a sufficiently deep weakened zone for the transfer of a sufficiently thick semiconductor layer.

It was observed that when the oxide layer is thick (in the order of 0.7 to 3 µm), the surface of the silicon transferred by the implanting and bonding process has greater roughness. As a result, the treatment intended to smooth the surface of the transferred thin layer and remove implanting defects will lead to the removal of a large amount of material, hence, the need to carry out implantation as deep as possible for the transfer of a sufficiently thick layer to obtain the desired thickness after polishing.

In addition, it was identified that there exists a critical thickness of the layer to be transferred over and above which the detachment wave applied for cleaving tends to press the peripheral crown of the donor substrate against that of the receiver substrate—with which it was not initially bonded—thereby generating transfer of donor substrate material into the peripheral crown of the receiver substrate. This critical thickness is dependent on the structure in which detachment is performed and, particularly, on the thickness of the layer to be transferred.

In general, with the disclosure, it is possible to prevent or at least reduce the jagged edge phenomenon by first identifying an implanting energy range (or at least an energy implanting value) for each species, which does not lead to the presence of zones transferred into the peripheral crown of the receiver substrate (this suitable energy being determined by inspecting the peripheral crown of the remaining donor substrate after detachment) and by using an implanting energy within the range (or equal to or lower than the identified value) to transfer a monocrystalline semiconductor layer from the donor substrate onto the receiver substrate. Optionally, if the implanting energy used corresponds to a thickness of the transferred layer that is narrower than the desired thickness for the thin semiconductor layer of the final SeOI structure, epitaxy is carried out on the transferred layer until the desired thickness is obtained.

With the disclosure, it is, therefore, possible initially, for a particular SeOI structure to be fabricated, to determine a suitable implanting energy for the two species to be implanted for the formation of the weakened zone.

This determination method implies the manufacturing of several test SeOI structures, each corresponding to different co-implantation energies, with a view to determining a window for the implanting process that would limit and even prevent the formation of the jagged edge.

More specifically, the manufacturing of test SeOI structures comprises the following steps (cf. FIG. 5):

(i) forming a dielectric layer (typically an oxide) on at least one of the donor substrate 30 and receiver substrate 10;
(ii) co-implanting species in the donor substrate 30 with a determined energy to form the weakened zone 31;
(iii) bonding the donor substrate 30 onto the receiver substrate 10 so that the dielectric layer lies at the bonding interface;
(iv) detaching the donor substrate 30 along the weakened zone 31 to transfer the monocrystalline semiconductor layer 32 and recover a remainder 34 of the donor substrate.

The remainder 34 of the substrate is used to determine whether the co-implantation conditions at step (ii) did or did not lead to a jagged edge phenomenon.

For this purpose, the peripheral crown CP of the remainder 34 of the donor substrate 30 is inspected with Edgescan™ equipment, which allows observation of defects on the periphery of a substrate. The equipment is widely used on production lines of SeOI structures and will not be described in detail herein.

This inspection allows the following conclusions to be reached:

if the crown of the remainder of the donor substrate exhibits zones that have been transferred onto the receiver substrate (revealing a jagged edge), the implanting energy at step (ii) is too high;
if the crown does not have zones transferred onto the receiver substrate (meaning that no jagged edge has been produced), the implanting energy at step (ii) is suitable.

Optionally, this inspection could be conducted on the SeOI structure which corresponds to the negative imprint of the remainder of the donor substrate. However, inspection of the remainder has the advantage that it can be conducted in parallel with the continuing manufacturing process of SeOI structures.

By conducting this testing for different implantation energies, a range of implantation energy is determined that will allow preventing the formation of a jagged edge.

Therefore, for subsequent manufacturing of SeOI structures, an implantation energy within the range will be used.

The manufacturing of these SeOI structures is carried out in accordance with the SMART CUT® process and allows an SeOI structure to be obtained such as illustrated in FIG. 5 that is substantially free of a jagged edge. The remainder of the donor substrate can be discarded or recycled for another use.

As can be seen in FIG. 5, the thickness of the transferred monocrystalline semiconductor layer 32 on the receiver substrate is denoted E1.

Figure 6:
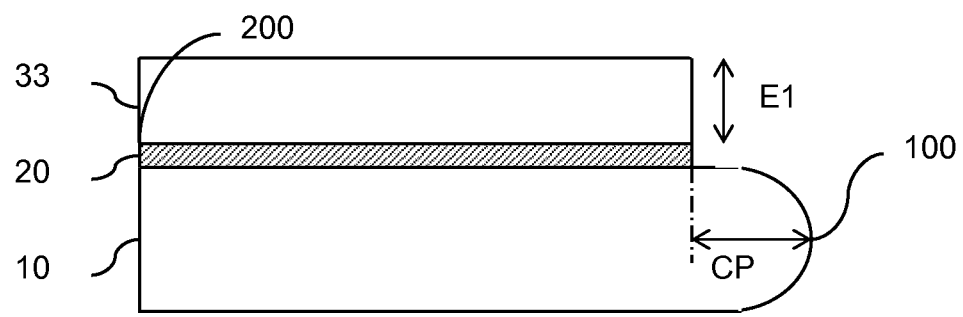
FIG. 6 is a cross-sectional view of the structure in FIG. 5 after epitaxial growth on the transferred layer.

If a thickness E2 greater than thickness E1 is desired for the thin layer of the SeOI structure, this additional thickness is obtained by conducting an epitaxy step on the transferred monocrystalline semiconductor layer 32 until the desired thickness E2 is obtained (final layer 33 illustrated in FIG. 6).

The range of suitable implantation energy may vary depending on the thickness of the buried oxide layer. Therefore, the determination method described above can be implemented for SeOI structures having different characteristics (in terms of materials, thickness of oxide layer, etc.).

Although helium and hydrogen are generally not implanted at the same energy, the implanting energy for helium is defined as a function of the implanting energy for hydrogen: the implanting energy for hydrogen is determined to obtain a determined depth of the weakened zone, then the implanting energy of helium is determined so that the implantation peak of helium is close to the implantation peak of hydrogen. As a result, in the present disclosure, it suffices to determine the suitable implanting energy for hydrogen and persons skilled in the art are then able to determine the helium implanting energy to be used.

Figure 7C:
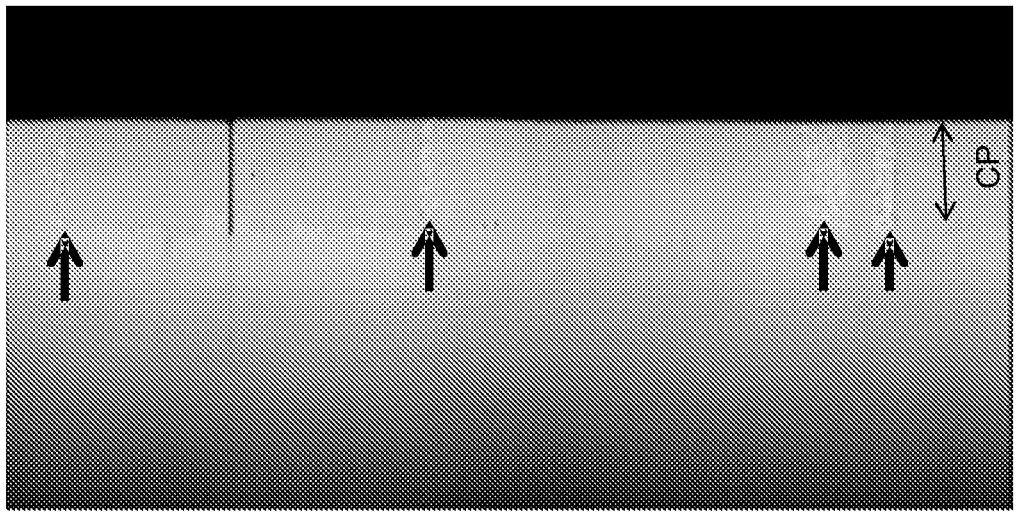
FIGS. 7A to 7C are inspection images of the peripheral crown of the remaining donor substrate with different implanting energies corresponding to different thicknesses of the transferred layer (respectively 350 nm, 420 nm and 600 nm).
Figure 7B:
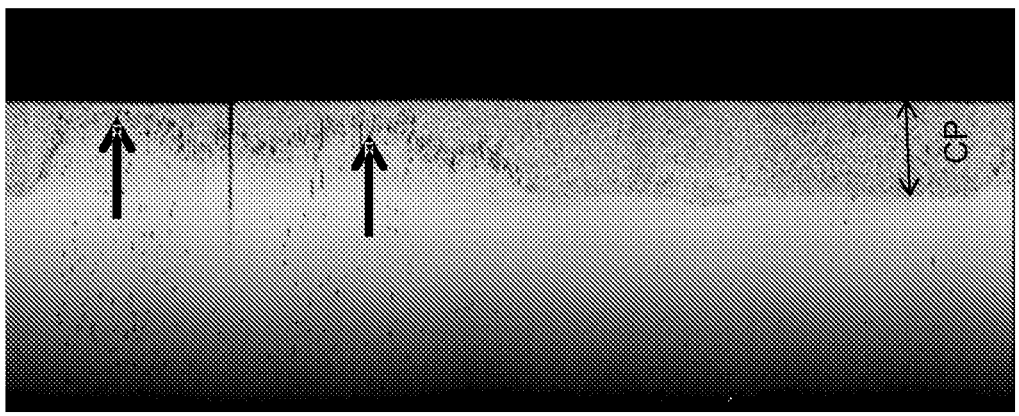
Figure 7A:
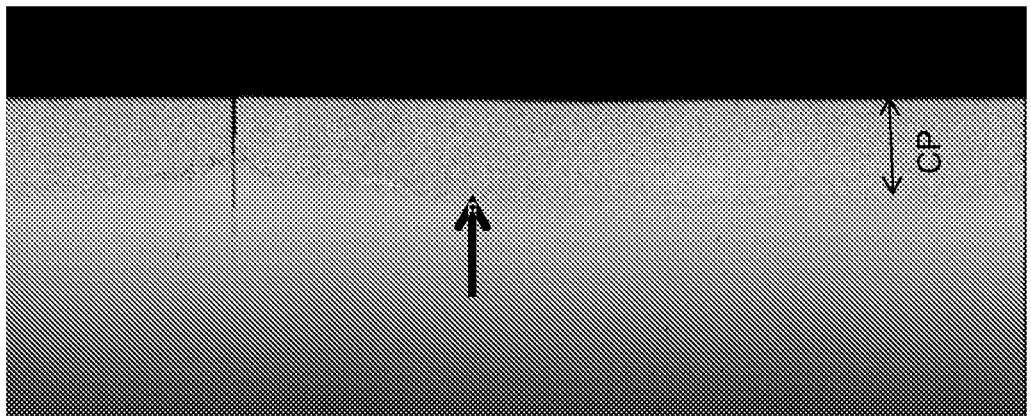

FIGS. 7A to 7C are views of Edgescan™ inspection of the peripheral crown CP of the remainder of the donor silicon substrate in an SeOI structure with an oxide layer of 1 μm thickness for different hydrogen implanting energies of between 32 keV and 68 keV. FIG. 7A corresponds to an implant depth of 350 nm, FIG. 7B to a depth of 420 nm and FIG. 7C to a depth of 600 nm. Although the donor substrate is circular, the image obtained with Edgescan™ shows the contour of the substrate as a straight line.

In FIG. 7A, the peripheral crown CP (corresponding to a non-transferred thickness of silicon onto the receiver substrate), the boundary of which in relation to the central part of the substrate is indicated by a thick arrow, is substantially regular. It is noted that this crown has a blistered appearance due to implantation.

In FIG. 7B, it can be seen that the peripheral crown is less regular. In particular, the zones indicated by thick arrows correspond to transfer of silicon from the donor substrate onto the receiver substrate.

In FIG. 7C, it can be seen that with the exception of a few zones indicated by thick arrows, the silicon of the peripheral crown has been transferred onto the receiver substrate (the appearance of the peripheral crown being similar to that of the central part of the substrate). This appears to be due to the fact that the layer to be transferred was fairly rigid and detachment fairly violent so that the donor substrate, which was initially not bonded to the receiver substrate in the edge roll off region, has been pressed against the receiver substrate as far as the edge thereof, leading to transfer of almost the entirety of the donor substrate onto the receiver substrate.

It is inferred from these figures that implanting energies leading to implant depths of 420 and 600 nm induce a jagged edge phenomenon and are, therefore, too high. On the other hand, an implanting energy leading to an implant depth of 350 nm is suitable.

As a result, for the manufacturing of SOIs having an oxide layer of 1 μm thickness, advantageously co-implantation of hydrogen and helium is performed to reach an implant depth of no more than 370 nm. Optionally, if the silicon layer of the SOI must have a greater thickness than the thickness of the transferred layer, epitaxy is used to obtain the required thickness.

REFERENCES

WO 2009/034113

The invention claimed is:

1. A method for determining a suitable implanting energy of at least two atomic species in a donor substrate to create a weakened zone defining a monocrystalline semiconductor layer to be transferred onto a receiver substrate, comprising the following steps:
   (i) forming a dielectric layer on at least one of the donor substrate and the receiver substrate;
   (ii) co-implanting the species in the donor substrate with an implanting energy to form the weakened zone, the species comprising hydrogen and helium;
   (iii) bonding the donor substrate on the receiver substrate so that the dielectric layer lies at the bonding interface;
   (iv) detaching the donor substrate along the weakened zone to transfer the monocrystalline semiconductor layer and recover a remainder of the donor substrate;
   (v) inspecting a peripheral crown of the remainder of the donor substrate or of the receiver substrate on which the monocrystalline semiconductor layer was transferred at step (iv);
   (vi) in response to detecting, in the inspected peripheral crown, zones of the donor substrate that have been transferred onto the receiver substrate at step (iv), determining that the implanting energy at step (ii) is too high and repeating steps (i) through (v) on another donor substrate using a lower implanting energy at step (ii); and
   (vii) in response to detecting, in the inspected peripheral crown, an absence of zones of the donor substrate, determining that the implanting energy is a suitable implanting energy and repeating steps (i) through (v) on another donor substrate using a higher implanting energy at step (ii),
   wherein the maximum implanting energy within a range of suitable implanting energy is determined, and the maximum thickness of the monocrystalline semiconductor layer to be transferred onto the receiver substrate is deduced therefrom.

2. A method for determining a suitable implanting energy of at least two atomic species in a donor substrate to create a weakened zone defining a monocrystalline semiconductor layer to be transferred onto a receiver substrate, comprising the following steps:
   (i) forming a dielectric layer on at least one of the donor substrate and the receiver substrate;
   (ii) co-implanting the species in the donor substrate with an implanting energy to form the weakened zone;
   (iii) bonding the donor substrate on the receiver substrate so that the dielectric layer lies at the bonding interface;
   (iv) detaching the donor substrate along the weakened zone to transfer the monocrystalline semiconductor layer and recover a remainder of the donor substrate;
   (v) inspecting a peripheral crown of the remainder of the donor substrate or of the receiver substrate on which the monocrystalline semiconductor layer was transferred at step (iv);
   (vi) if the peripheral crown exhibits zones transferred onto the receiver substrate, determining that the implanting energy at step (ii) is too high; and
   (vii) if the peripheral crown does not exhibit zones transferred onto the receiver substrate, determining that the implanting energy at step (ii) is suitable,
   wherein step (ii) is implemented on several donor substrates with different respective implanting energies, and after inspection of the remainder of the donor substrate or of the receiver substrate on which the monocrystalline semiconductor layer was transferred, a suitable range of implanting energy is determined for each of the implanting energies.

3. A method for manufacturing a semiconductor-on-insulator structure via transfer of a monocrystalline semiconductor layer from a donor substrate to a receiver substrate, comprising the following steps:
   (a) determining a suitable implanting energy with the method according to claim 2;
   (b) forming a dielectric layer on at least one of the receiver substrate and the donor substrate;
   (c) co-implanting atomic species, such as comprising hydrogen and helium, with the implanting energy determined at step (a), to create a weakened zone in the donor substrate so as to define a monocrystalline semiconductor layer to be transferred;
   (d) molecularly bonding the donor substrate on a receiver substrate, said dielectric layer lying at the bonding interface; and
   (e) detaching the donor substrate along the weakened zone, to transfer the monocrystalline semiconductor layer onto the receiver substrate.

4. The method of claim 3, wherein the suitable implanting energy determined at step (a) corresponds to a thickness of the monocrystalline semiconductor layer transferred at step (e) that is narrower than a desired thickness for the monocrystalline semiconductor layer of the semiconductor-on-insulator structure, the method further comprising, after step (e), an epitaxy step (f) on the monocrystalline semiconductor layer transferred onto the receiver substrate until the desired thickness is obtained.

5. A method for manufacturing a semiconductor-on-insulator structure via transfer of a monocrystalline semiconductor layer from a donor substrate to a receiver substrate, comprising the following steps:

(a) determining a suitable implanting energy with the method according to claim 2;
(b) forming a dielectric layer on at least one of the receiver substrate and the donor substrate;
(c) co-implanting atomic species, such as comprising hydrogen and helium, with the implanting energy determined at step (a), to create a weakened zone in the donor substrate so as to define a monocrystalline semiconductor layer to be transferred;
(d) molecularly bonding the donor substrate on a receiver substrate, said dielectric layer lying at the bonding interface; and
(e) detaching the donor substrate along the weakened zone, to transfer the monocrystalline semiconductor layer onto the receiver substrate.

6. The method of claim 5, wherein the suitable implanting energy determined at step (a) corresponds to a thickness of the monocrystalline semiconductor layer transferred at step (e) that is narrower than a desired thickness for the monocrystalline semiconductor layer of the semiconductor-on-insulator structure, the method further comprising, after step (e), an epitaxy step (f) on the monocrystalline semiconductor layer transferred onto the receiver substrate until the desired thickness is obtained.

* * * * *

UNITED STATES PATENT AND TRADEMARK OFFICE
CERTIFICATE OF CORRECTION

Page 1 of 1

PATENT NO. : 10,777,447 B2
APPLICATION NO. : 16/081816
DATED : September 15, 2020
INVENTOR(S) : Ludovic Ecarnot, Nadia Ben Mohammed and Carine Duret It is certified that error appears in the above-identified patent and that said Letters Patent is hereby corrected as shown below:

On the Title Page
In ITEM (57), Line 20, change "if said the crown" to --if the crown--

In the Specification
Column 2, Lines 15 & 16, change "the abovementioned controlling" to --the above-mentioned controlling--
Column 3, Line 10, change "of simiconductor-on-insulator" to --of semiconductor-on-insulator--
Column 3, Line 33, change "the simiconductor-on-insulator" to --the semiconductor-on-insulator--

Signed and Sealed this
Sixteenth Day of February, 2021

Drew Hirshfeld
*Performing the Functions and Duties of the
Under Secretary of Commerce for Intellectual Property and
Director of the United States Patent and Trademark Office*